United States Patent
Farnworth

(10) Patent No.: US 6,252,302 B1
(45) Date of Patent: *Jun. 26, 2001

(54) HEAT TRANSFER MATERIAL FOR AN IMPROVED DIE EDGE CONTACTING SOCKET

(76) Inventor: Warren M. Farnworth, 2004 S. Banner, Nampa, ID (US) 83686

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/716,084

(22) Filed: Sep. 19, 1996

(51) Int. Cl.[7] .................................................. H01L 23/34
(52) U.S. Cl. .......................... 257/723; 257/704; 257/710; 257/795
(58) Field of Search ..................................... 257/704, 710, 257/723, 725, 726, 706, 707, 789, 795

(56) References Cited

U.S. PATENT DOCUMENTS

| | | |
|---|---|---|
| 3,500,131 | 3/1970 | Seeley et al. .......................... 317/120 |
| 3,648,113 | 3/1972 | Rathjen et al. ....................... 317/100 |
| 3,760,486 | 9/1973 | Rifkin et al. .............................. 29/278 |
| 3,812,402 | 5/1974 | Garth ..................................... 317/100 |
| 3,829,817 | 8/1974 | Beavitt ................................ 339/17 F |
| 3,896,544 | * 7/1975 | Fosnough ................................ 29/588 |
| 4,328,530 | 5/1982 | Bajorek et al. ........................ 361/308 |
| 4,502,100 | 2/1985 | Greenspan et al. ................... 361/384 |
| 4,782,893 | * 11/1988 | Thomas ................................. 165/185 |
| 5,016,084 | * 5/1991 | Nakao ...................................... 357/72 |
| 5,106,451 | * 4/1992 | Kan et al. ........................... 156/583.3 |
| 5,173,764 | * 12/1992 | Higgins, III .......................... 257/669 |
| 5,258,647 | * 11/1993 | Wojnarowski et al. ............... 257/687 |
| 5,309,983 | * 5/1994 | Bailey .................................. 165/80.3 |
| 5,349,240 | * 9/1994 | Narita et al. .......................... 257/791 |
| 5,424,652 | * 6/1995 | Hambree et al. ..................... 324/765 |
| 5,528,462 | * 6/1996 | Pandse ................................. 361/767 |
| 5,767,443 | * 6/1998 | Farnworth et al. ..................... 174/50 |

* cited by examiner

*Primary Examiner*—Stephen D. Meier
*Assistant Examiner*—Jeff Vockrodt
(74) *Attorney, Agent, or Firm*—Fletcher, Yoder & Van Someren

(57) ABSTRACT

An improved die edge contacting socket incorporates particles of a thermally conducting material into an elastomeric compression pad disposed in the sealing cap of the socket. The elastomeric compression pad is preferably composed of an electrically insulating material, such as a silicone-based gel. The thermally conducting material is preferably either diamond, beryllium oxide, silicon nitride, or a like material.

22 Claims, 3 Drawing Sheets

HEAT TRANSFER MATERIAL FOR AN IMPROVED DIE EDGE CONTACTING SOCKET

FIELD OF THE INVENTION

The present invention relates to packaging of semiconductor integrated circuits and, more particularly, to a multi-die encapsulation device.

BACKGROUND OF THE INVENTION

Modern semiconductor computing systems have often utilized sets of individually packaged semiconductor dice mounted and interconnected on a circuit board. More recent designs have eliminated the numerous individual die packages in favor of a single package cable of housing several bare dice. The advantages of such systems are greater computing power per unit area of circuit board, and lower packaging cost. FIG. 1 shows a portion of an example of such a conventional multi-dice package, illustrated in a cross-sectional view. The dice are initially formed in large groups on wafers. By cutting the wafer, the dice individually segregated. The encapsulation device is typically molded plastic and has a chamber portion comprised of a plurality of die chambers 5. Each chamber has at least one beveled edge 10. A bare die is inserted by hand into a chamber 5 with the circuit side touching the beveled edge 10. The beveled edge 10 thus serves as a guide for the insertion of the bare die. However, since the circuit slides across the bevel, the circuitry may be damaged during insertion. The bare die is retained by a spring-retaining and contact assembly 15 located at the bottom of the chamber 5. The retaining and contact assembly 15 holds the bare die in position in the encapsulation device, with a spring portion 20 electrically contacting the bare die.

A rigid foot portion 25 is provided for contacting a circuit board onto which the encapsulation device is mounted. Due to the rigidity of the foot portion 25 and inherent bowing of many circuit boards, the failure rate of electrical contact between the bare dice and the board is typically high. At times the failure rate runs as high as 80%.

Heat dissipation is a persistent problem in the packaging systems of virtually all semiconductor devices, including the encapsulation device shown in FIG. 1. Long-term exposure to excessive temperatures may impede the operation of a die or lead to an electrical failure. There are various approaches available to lessen the problem of die heating that involve either redesigning the die circuitry or modifying the encapsulation device. For instance, designing circuits to operate at lower voltage levels may provide a partial solution. However, lower operating voltages may not be possible for a given die.

Alternatively, certain features may be incorporated into the encapsulation device itself to improve heat transfer. The encapsulation device shown in FIG. 1 provides few pathways for the transfer of heat from the dice. This is due to the relatively small amount of physical contact between the encapsulation device and the dice and to the less than optimal thermoconductivity for molded plastic. Although there will be some minimal amount of natural convective heat transfer between the dice and the ambient, the amount is of little consequence. Further, radiative heat transfer does not ordinarily play a significant role because the temperatures required for significant radiative heat transfer from the dice are normally higher than the maximum permissible operating temperature of the dice.

To improve heat transfer from the dice, a cap, of the type to be described below, may be placed on the encapsulation device shown in FIG. 1, and may be modified in several ways, depending on the heat output of the dice. For a relatively low heat output combination of dice, the cap may be made of metal to improve conduction from the die chambers 5. If additional heat transfer capacity is necessary, the cap may be fitted with slots, and possibly a forced air supply, to improve convection. The cap may be also be provided with fins to improve both the conduction and convection. The addition of fins, slots, and fans increases the complexity of the device, and space limitations may rule out their use. Furthermore, even with the aforementioned modifications, the predominant heat transfer mechanism will continue to be convection, which is less efficient than conduction.

In addition to these problems, solid caps secured over the chamber portion of the encapsulation device may not retain the dice in the correct position and often are a cause of dice damage subsequent to encapsulation of the dice.

Thus, a need exists for an encapsulation device for bare dice which provides reliable electrical contact between the dice and a mounting board and a need exists for a method for safely inserting the bare dice into the encapsulation device. In addition, there is a need to provide position retainment of the bare dice within the encapsulation device without fear of dice damage following encapsulation, and a need to incorporate conductive heat dissipation features into the encapsulation device without the need for space limiting heat sinks or circuit design changes to accommodate lower voltages.

SUMMARY OF THE INVENTION

In one aspect of the present invention, an encapsulation device is provided. The encapsulation device has a chamber portion that includes a die chamber that is operable to accept one bare die. There is also a pad of elastomeric material containing particles of a thermally conducting material for biasing the bare dice in the die chamber.

In another aspect of the present invention, a cap for mating with and sealing an encapsulation device that is operable to house bare die is provided. The cap includes an elastomeric compression pad for biasing the bare die in a correct orientation when the bare die is inserted into a chamber in the encapsulation device. The elastomeric material contains particles of a thermally conducting material.

In still another aspect of the present invention, an encapsulation device is provided. The encapsulation device includes a chamber portion comprising a plurality of parallel die chambers. Each of the plurality of die chambers is operable to accept one bare die of a plurality of bare die. A cap portion for mating with and sealing a top portion of the chamber portion is provided. The cap portion comprises an elastomeric compression pad for biasing the bare die in a correct orientation when the bare die is inserted into a chamber. The elastomeric compression pad contains particles of a thermally conducting material.

In a further aspect of the present invention, a method of forming an encapsulation device is provided. In the method, a chamber portion is provided that includes a plurality of die chambers. Each of the plurality of die chambers is operable to accept one bare die. A cap portion is provided for mating with and sealing a top portion of the chamber portion. The cap portion is provided with a thermally conducting elastomeric compression pad for biasing the bare die in a given orientation when the bare die is inserted into a chamber.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 2:
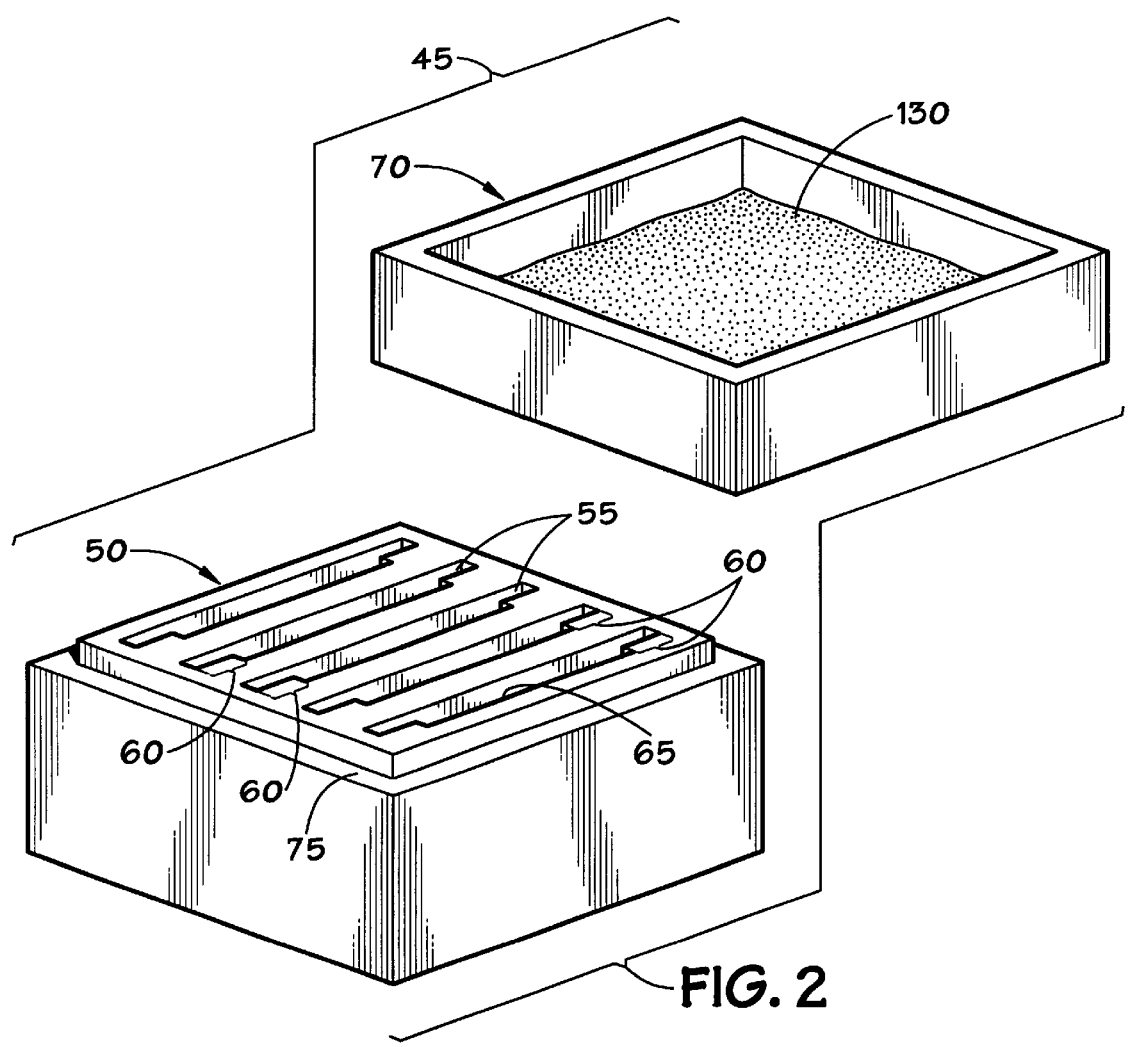
FIG. 2 is a three-dimensional view of the encapsulation device of the invention prior to insertion of bare die and prior to final assembly.

FIG. 2 is a three-dimensional view of the encapsulation device 45 of the invention prior to insertion of bare die into the encapsulation device. A chamber portion 50 comprises a plurality of chambers 55 for accepting and retaining the bare dice. The exact number of chambers 55 may vary depending on design considerations. Each chamber 55 comprises retaining edges 60 which define a chamber void 65. The chamber void 65 accepts a bare die insertion tool during the process of inserting the bare die into each chamber 55.

When the bare dice have been inserted into the chambers 55, a cap 70 is sealed to the chamber portion. The cap 70 rests on lip 75 of the chamber portion 50. The final locking seal between the cap 70 and the lip 75 is typically an epoxy which when heated allows the cap 70 to be removed and resealed, thereby allowing for the removal and the replacement of faulty dice. However, other locking seals, such as a snap seal, a grooved seal, or a pressure seal, may work equally well. The chamber portion 50 and the cap 70 are typically a molded plastic, such as, for example, glass filled polysulfone, polyethersulfone (sometimes referred to alternatively as "PES"), polyamidimide (sometime referred to alternatively as "PAI" or Porlon®), polyphenyline-sulfide, high temperature PCT polyester, or a like plastic.

Figure 3:
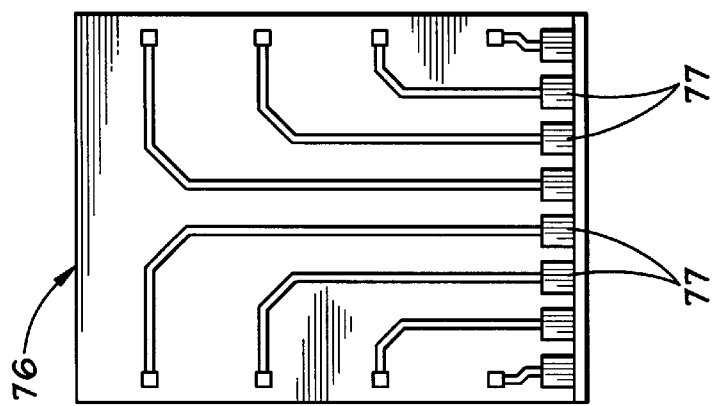
FIG. 3 is a simplified schematic of a bare die and the die pads thereon.

FIG. 3 is representative of a single bare die 76 designed to fit into the encapsulation device 45. In this case the single die 76 has eight die pads 77, although it is possible for the bare dice to have any number of die pads.

Figure 4:
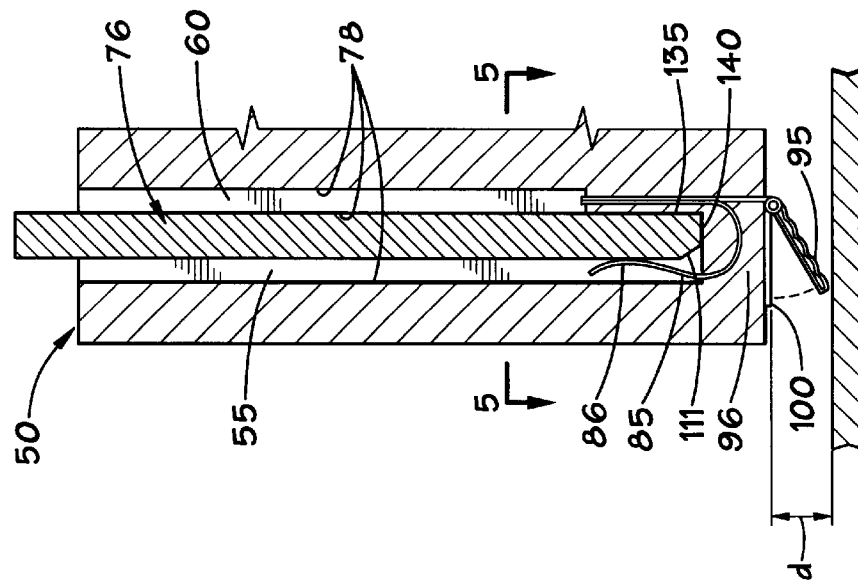
FIG. 4 is a cross-sectional view of one chamber of the encapsulation device of the invention with a bare die inserted and seated therein.

FIG. 4 is a cross-sectional view of a single die chamber 55 having parallel walls 78. A bare die 76 inserted into the die chamber 55 is retained against the retaining edges 60 by retaining contact 85. The retaining contact 85 electrically contacts one of the die pad 77 of bare die 76 (see FIG. 3) at a spring portion 86 and electrically contacts a circuit board 90 with a compliant foot portion 95 when the bare die 76 is seated in the die chamber 55. Thus, the retaining contact 85 protrudes through a bottom portion 96 of the chamber portion 50. The compliant contact foot 95 provides reliable contact to the circuit board 90 even though the circuit board 90 may be bowed. It can be seen from FIG. 4 that the compliant foot 95 has a vertical displacement d. Therefore, as long as the distance between the reference foot 100 and the circuit board 90 is less than d, and the distance accommodates a width of the compliant foot 95, the compliant foot 95 makes contact with the circuit board 90. The number of retaining contacts 85 is equal to the number of die pads 77 on the bare die 76. Therefore, for the bare die of FIG. 2, there would be eight retaining contacts 85 in a die chamber 55.

Figure 1:
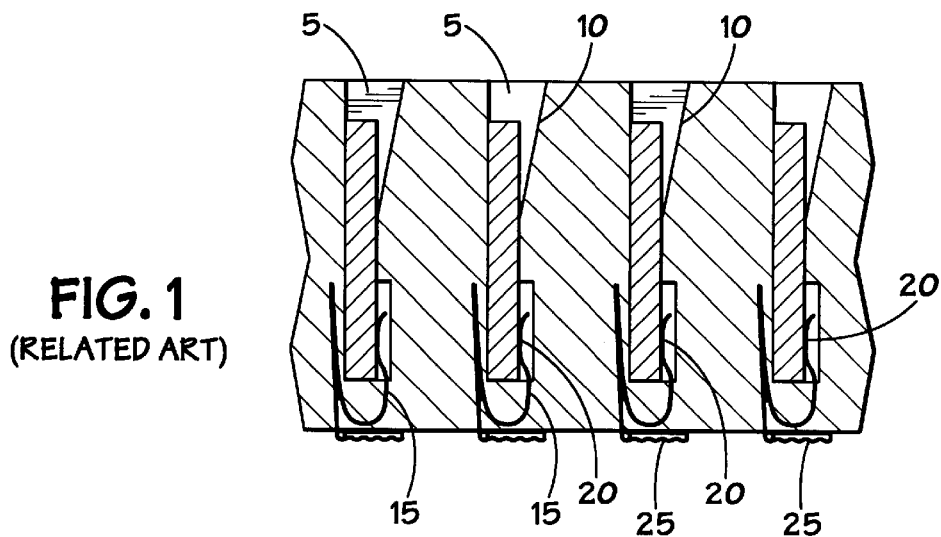
FIG. 1 is a simplified encapsulation device of the related art.
Figure 5:
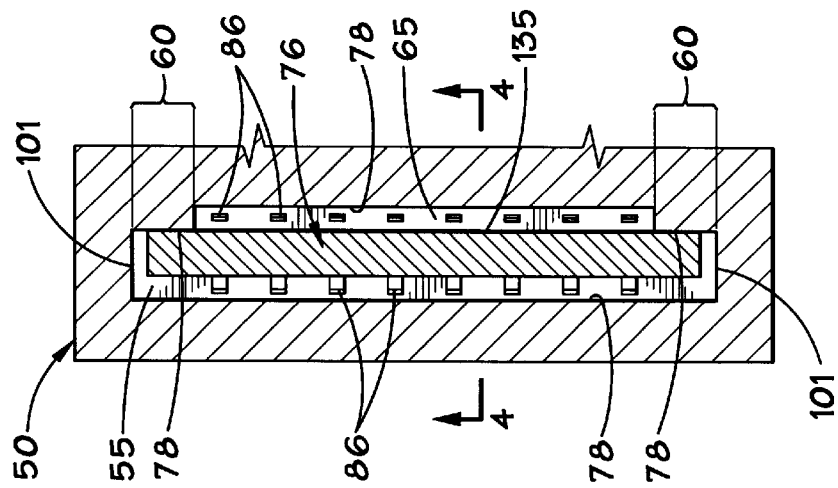
FIG. 5 is a top view of one chamber of the encapsulation device of the invention with a bare die inserted therein.

FIG. 5 is a top view of a single die chamber 55. In addition to elements previously named, a pair of opposed parallel walls 101 is shown in FIG. 5. Preferably, the chamber portion 50 shown in FIG. 1 is oriented during bare die insertion, such that the chambers 55 are stacked. This orientation allows for a simplified insertion process which can best be understood with reference to FIGS. 3, 4, 5, 6, and 7.

Figure 6:
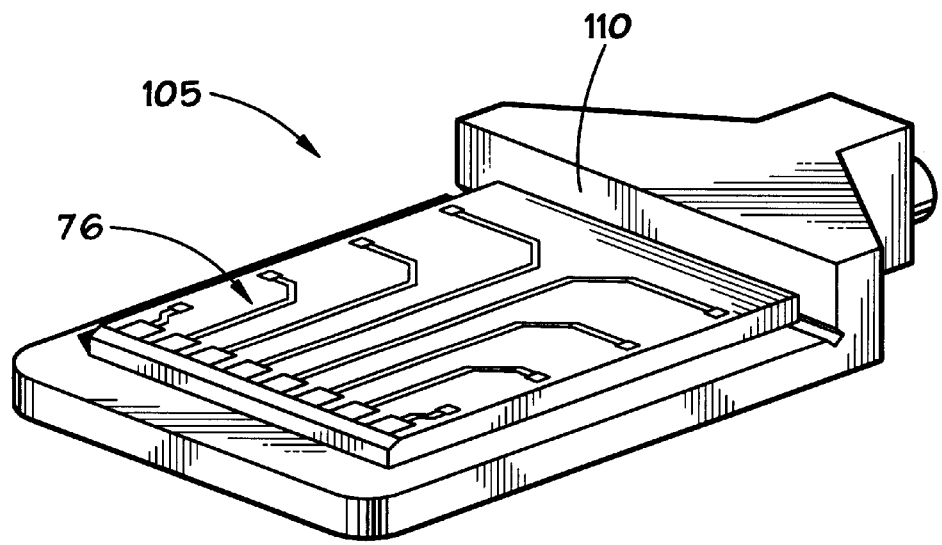
FIG. 6 is a three-dimensional view of a bare die insertion tool of the invention.
Figure 7:
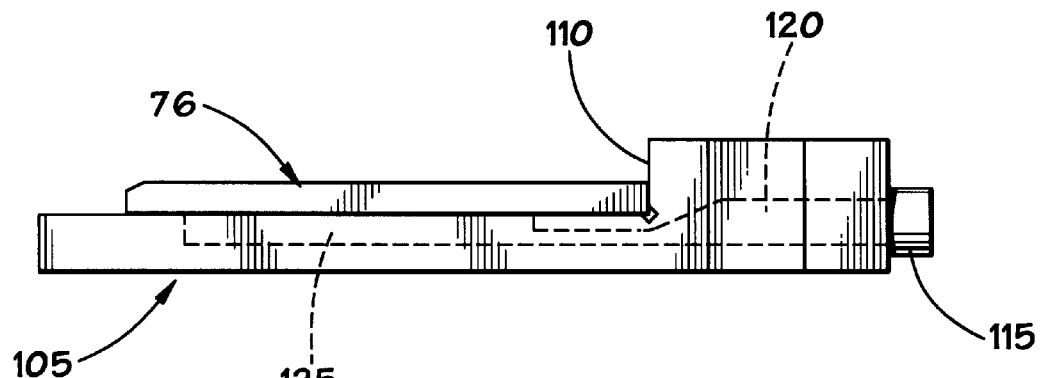
FIG. 7 is a side view of the three-dimensional view of the bare die insertion tool of FIG. 6.

A bare die 76 is placed on an insertion tool 105, shown three dimensionally in FIG. 6 and cross-sectionally in FIG. 7, with the circuit side of the bare die 76 up, thereby preventing damage to the circuitry of the bare die 76. The insertion tool 105 is then inserted into the chamber void 65 between the two retaining edges 60. The guide edge 110 of the insertion tool 105 is used to mechanically force the bare die 76 into the retaining contact 85 (see FIG. 4). The bare die 76 is held in a correct orientation on the insertion tool 105 with a vacuum provided by a vacuum source (not shown). The vacuum source is connected to the insertion tool 105 at vacuum connection 115 through a means such as a plastic hose (not shown). Internal passages 120 connected to the vacuum connection 115 directs the vacuum to suction depressions 125. Thus the die insertion tool 105 allows for insertion of the bare die 76 into chamber 55 without damage to die circuitry.

Not only does the process and encapsulation device of the invention prevent damage to die circuitry, but there is also a space savings over the beveled wall chamber of the related art shown in FIG. 1. It should also be noted that the exact orientation of the parallel chamber walls is unimportant. For example, they may be at an angle of less than 90 degrees to the circuit board to which the encapsulated device attaches. In this case, the chambers 55 may be slanted to form a low profile encapsulation device.

After the bare dice 76 have been inserted into the desired chambers 55, the cap 70 is seated on lip 75 (see FIG. 1) and retained and sealed to the chamber portion 50 with a sealant glue. The cap contains a compression pad 130 which provides a flexible bias to the bare dice 76. Various substances may be used for the compression pad, including a variety of springs, gels, or foams. Because of the flexible bias, the compression pad 130 biases the bare dice firmly into the retaining contact. Therefore, the compression pad 130 of the cap 70 helps to eliminate breakage of the bare dice, even with jarring. The seating of the cap 70 on the lip 75 completes the encapsulation process.

The skilled artisan will appreciate that the compression pad 130 not only serves die-retaining and shock-absorbing functions, but also has the potential to provide a significant capability to transfer heat away from the dice 76. In the absence of some structure to contact the top of the dice 76, the paths for conductive heat transfer will be limited to those areas of contact between the chamber 55 and the dice 76, at the surfaces 135 and 140, and at the interface between the spring portion 86 and the dice 76 as shown in FIGS. 4 and 5. However, the biasing contact between the elastomeric compression pad 130 and the top of the tie 76 may provide a significant conductive heat transfer pathway, depending upon the materials selected for the compression pad 130 and the cap 70.

In an embodiment, the compression pad 130 may be advantageously formed from an electrically-insulating, elastomeric material, such as a silicone-based jell that is impregnated with particles of a thermally conducting material, such as diamond, beryllium oxide, silicon nitride, or like materials. The silicone-based elastomeric material is typically a three-part mixture of a base material, a hardening material, and a diluent material. The Shore-A or Durometer value for the elastomeric material is influenced by the amount of hardening material—a higher amount of hardening material results in a higher Shore-A or Durometer value. The diluent material influences the viscosity of the mixture. Silicone-based materials are preferred due to their high elasticity and desirable electrical insulating properties. If relatively high temperatures are anticipated, the compression pad 130 may be fabricated from a polyamide silicone-based material. The mean size of the relatively small conducting particles, as well as their concentration in the elastomeric material, is a matter of discretion on the part of the designer. Relatively smaller sized particles in the range of 5 to 10 microns are preferred since the thermal conductivity of the conducting particles normally does not diminish with particle size, and relatively larger particles may damage the dice 76.

Depending upon the amount of heat dissipation required, different combinations of materials for the compression pad 130 and the cap 70 may be selected. For example, the cap 70 may be fabricated from molded plastic, and the compression pad 130 may be fashioned from a silicone-based jell with a Shore-A value of about 45 that is impregnated with diamond particles. If higher heat dissipation is necessary, the cap 70 may be fabricated from a material with a higher thermoconductivity, such as aluminum or other metallic material. A metallic cap 70 ordinarily would be undesirable due to the potential for short-circuiting between the cap 70 and the dice 76. However, the excellent insulating properties of the elastomeric material permit the use of a metallic material for the cap 70. In addition, if space and power consumption are not unduly limited, other heat sink devices, such as fins, may be incorporated into the cap 70 to provide additional material available for heat conduction and to provide a larger available surface area for convective heat transfer. In addition, a fan may be used to provide forced convection.

Alternatively, the compression pad 130 may be potted, that is, poured directly over the dice 76 and into the slots 55, thereby sealing the slots 55. This alternative provides the aforementioned die-retaining, shock-absorbing and heat dissipation advantages, however, it does render the installation of the dice 76 permanent.

The exact dimensions of the encapsulation device 45 will depend on the size of the dice. In a preferred embodiment the encapsulation device 45 is approximately 600 mils long, approximately 630 mils wide, and approximately 270 mils high with the cap 70 in place, the cap 70 itself, being approximately 70 mils high. In this preferred embodiment, each chamber 55 is approximately 570 mils long, slightly more than approximately 18 mils wide at its widest point, and approximately 215 mils deep at its deepest point.

Although the invention has been described with respect to specific embodiments, the invention is limited only as claimed.

What is claimed is:

1. An encapsulation device, comprising:
   a chamber portion having a die chamber having a bottom surface, the die chamber being operable to accept and removably couple with at least one bare die in a substantially upright orientation relative to the bottom surface; and
   an elastomeric pad containing thermally conducting particles, wherein the elastomeric pad is adapted for removably contacting and pressurably biasing the at least one bare die into the die chamber.

2. The encapsulation device of claim 1, wherein the elastomeric pad comprises a silicone-based gel.

3. The encapsulation device of claim 1, wherein the thermally conducting particles comprise diamond.

4. The encapsulation device of claim 1, comprising a foot coupled to the die chamber, wherein the foot is adapted to springably and electrically contact a circuit board.

5. The encapsulation device of claim 4, comprising a gap between the die chamber and the circuit board, wherein the foot springably bridges the gap and electrically couples the bare die to the circuit board.

6. The encapsulation device of claim 4, wherein the elastomeric pad is affixed to the bare die.

7. The encapsulation device of claim 6, wherein the elastomeric pad extends into the die chamber around the bare die, and fixedly couples the bare die to the die chamber.

8. The encapsulation device of claim 1, comprising a cap adapted to mate with and seal the encapsulation device, and adapted to contact and pressurably bias the elastomeric pad towards the bare die.

9. The encapsulation device of claim 8, wherein the cap further comprises a plurality of fins.

10. The encapsulation device of claim 8, wherein the cap comprises an electric fan.

11. The encapsulation device of claim 8, wherein the cap comprises a metallic material.

12. The encapsulation device of claim 11, wherein the metallic material comprises aluminum.

13. A cap for mating with and sealing a housing assembly for bare die, the cap comprising:
    an elastomeric pad containing thermally conducting particles, wherein the elastomeric pad is adapted for removably contacting and pressurably biasing the bare die into a die chamber in the housing assembly, the die chamber having a bottom surface, the die chamber being adapted for removably mounting the bare die in a substantially upright orientation relative to the bottom surface.

14. The encapsulation device of claim 13, wherein the elastomeric pad comprises a silicone-based gel.

15. The encapsulation device of claim 13, wherein the thermally conducting particles comprise diamond.

16. An encapsulation device, comprising:
    a chamber portion comprising a plurality of die chambers, each of the plurality of die chambers having a bottom surface and being adapted to accept and removably mount one bare die in a substantially upright orientation relative to the bottom surface; and
    a cap portion adapted for mating with and sealing a top portion of the chamber portion, wherein the cap portion comprises an elastomeric pad adapted for removably contacting and pressurably biasing the bare die into the die chamber, the elastomeric pad containing thermally conducting particles.

17. The encapsulation device of claim 16, wherein the elastomeric pad comprises a silicone-based gel.

18. The encapsulation device of claim 16, wherein the thermally conducting particles comprise diamond.

19. A system for protecting a bare die, the system comprising:
    a die housing assembly configured for physically enclosing and mechanically protecting the bare die, the die housing assembly comprising:

a die chamber having a bottom surface and configured for a substantially upright insertion and mounting of the bare die relative to the bottom surface; and a coupling assembly disposed in the die chamber, the coupling assembly configured for electrically and removably coupling the bare die to the die chamber; and a cover assembly comprising an elastomeric material and thermally conducting particles, wherein the cover assembly is configured for removably contacting and pressurably biasing the bare die into the die chamber, and for transferring heat from the bare die.

20. The system of claim 19, wherein the elastomeric material comprises a silicone-based gel.

21. The system of claim 19, wherein the thermally conducting particles comprise diamond.

22. The system of claim 19, wherein the coupling assembly comprises a flexible contact assembly extending from the die housing assembly, the flexible contact assembly configured for bridging a gap between the die housing assembly and an external circuit board, and for electrically coupling the bare die to the external circuit board.

* * * * *